(12) United States Patent
Rokugawa

(10) Patent No.: US 9,431,333 B2
(45) Date of Patent: Aug. 30, 2016

(54) WIRING SUBSTRATE

(71) Applicant: SHINKO ELECTRIC INDUSTRIES CO., LTD., Nagano-ken (JP)

(72) Inventor: Takahiro Rokugawa, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/753,203

(22) Filed: Jun. 29, 2015

(65) Prior Publication Data

US 2016/0005685 A1    Jan. 7, 2016

(30) Foreign Application Priority Data

Jul. 4, 2014  (JP) .................. 2014-138731

(51) Int. Cl.
*H01L 23/498*    (2006.01)

(52) U.S. Cl.
CPC ... *H01L 23/49827* (2013.01); *H01L 23/49822* (2013.01); *H01L 23/49838* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01)

(58) Field of Classification Search
CPC .................. H01L 23/49827; H01L 23/49822; H01L 23/49838; H05K 1/181
USPC ......... 174/260, 261, 267; 361/760, 767, 768
See application file for complete search history.

(56) References Cited

U.S. PATENT DOCUMENTS

| | | | | |
|---|---|---|---|---|
| 7,253,364 B2* | 8/2007 | Tang | ...................... | C25D 5/022 174/255 |
| 2009/0263938 A1* | 10/2009 | Ino | ...................... | H01L 21/4846 438/124 |
| 2011/0108313 A1* | 5/2011 | Kung | ...................... | H05K 3/062 174/261 |
| 2013/0168132 A1* | 7/2013 | Lee | ...................... | H05K 3/00 174/250 |

FOREIGN PATENT DOCUMENTS

JP    2007-103878    4/2007

* cited by examiner

*Primary Examiner* — Hoa C Nguyen
*Assistant Examiner* — Amol Patel
(74) *Attorney, Agent, or Firm* — Fish & Richardson P.C.

(57) ABSTRACT

A wiring substrate includes a wiring layer. Metal posts are arranged on the wiring layer. The metal posts are used to mount an electronic component. A protective layer covers a surface of the wiring layer on which the metal posts are arranged. The wiring layer includes a seed layer and a metal plating layer. The metal plating layer has a size that is the same as that of the seed layer in a plan view. The metal posts each include an upper end, which projects from the protective layer, and a lower end, which has a width that is the same as that of the upper end or greater. The protective layer includes a fillet for each metal post. The fillet extends toward an upper end surface of the corresponding metal post and contacts a side surface of the corresponding metal posts.

16 Claims, 6 Drawing Sheets

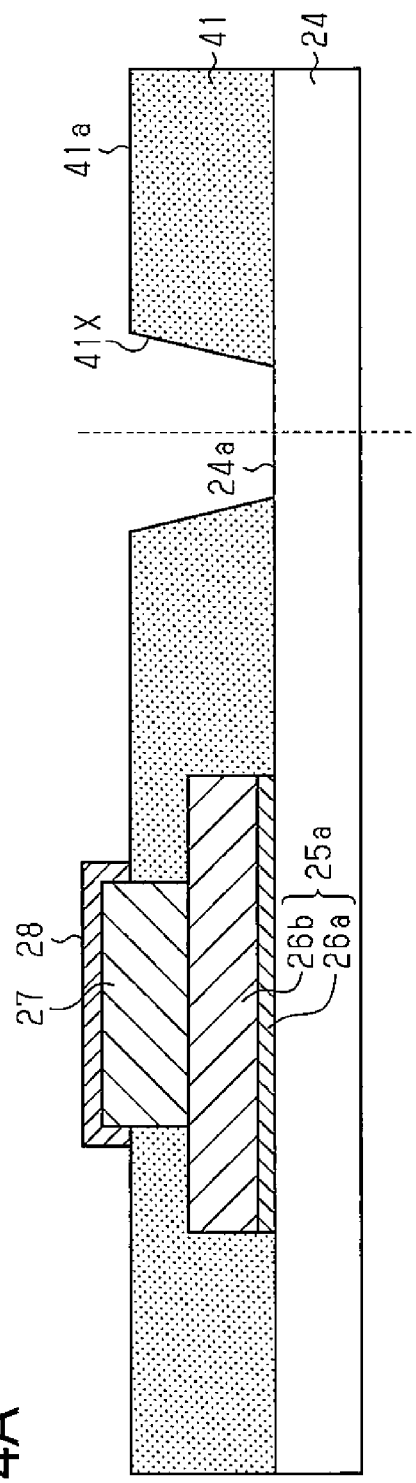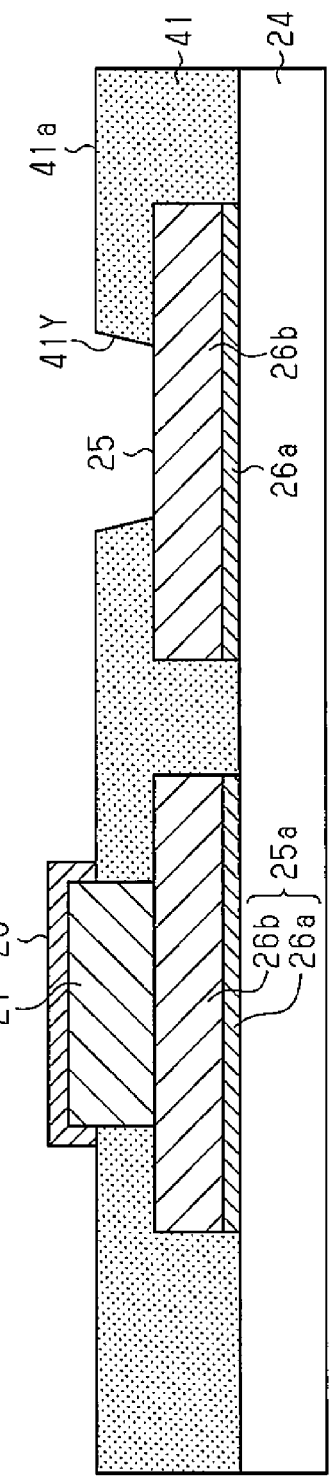

WIRING SUBSTRATE

CROSS-REFERENCE TO RELATED APPLICATIONS

This application is based upon and claims the benefit of priority from prior Japanese Patent Application No. 2014-138731, filed on Jul. 4, 2014, the entire contents of which are incorporated herein by reference.

BACKGROUND ART

The present disclosure relates to a wiring substrate and a method for manufacturing a wiring substrate.

A semiconductor element may be, for example, flip-chip-mounted on a circuit substrate. A circuit substrate includes electrodes (pads) and a resist layer. The electrodes are exposed through openings formed in the resist film. Solder bumps are formed on the exposed electrodes. The solder bumps connect the circuit substrate to a semiconductor element. A further circuit substrate includes bumps exposed through openings in a resist layer. Plating is applied to each bump for connection with an electrode. The bumps connect the circuit substrate to a semiconductor element (refer to Japanese Laid-Open Patent Publication No. 2007-103878).

The integration of semiconductor elements has increased the number of terminals (pins) connecting the semiconductor elements to the wiring substrate, while narrowing the connection terminal pitch of the semiconductor elements. Thus, there is a need for a wiring substrate that is applicable to such semiconductor elements.

SUMMARY

One aspect of the present disclosure is a wiring substrate including a wiring layer. Metal posts are arranged on the wiring layer. The metal posts are used to mount an electronic component. A protective layer covers a surface of the wiring layer on which the metal posts are arranged. The wiring layer includes a seed layer and a metal plating layer formed on the seed layer. The metal plating layer has a size that is the same as that of the seed layer in a plan view. The metal posts each include an upper end, which projects from the protective layer, and a lower end, which has a width that is the same as that of the upper end or greater. The protective layer includes a fillet for each of the metal posts. The fillet extends toward an upper end surface of the corresponding one of the metal posts and contacts a side surface of the corresponding one of the metal posts.

Other aspects and advantages of the present disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the presently preferred embodiments together with the accompanying drawings in which:

FIGS. 4A and 4B are partial cross-sectional views of a further wiring substrate;

DETAILED DESCRIPTION OF THE EMBODIMENTS

Figure 1A:
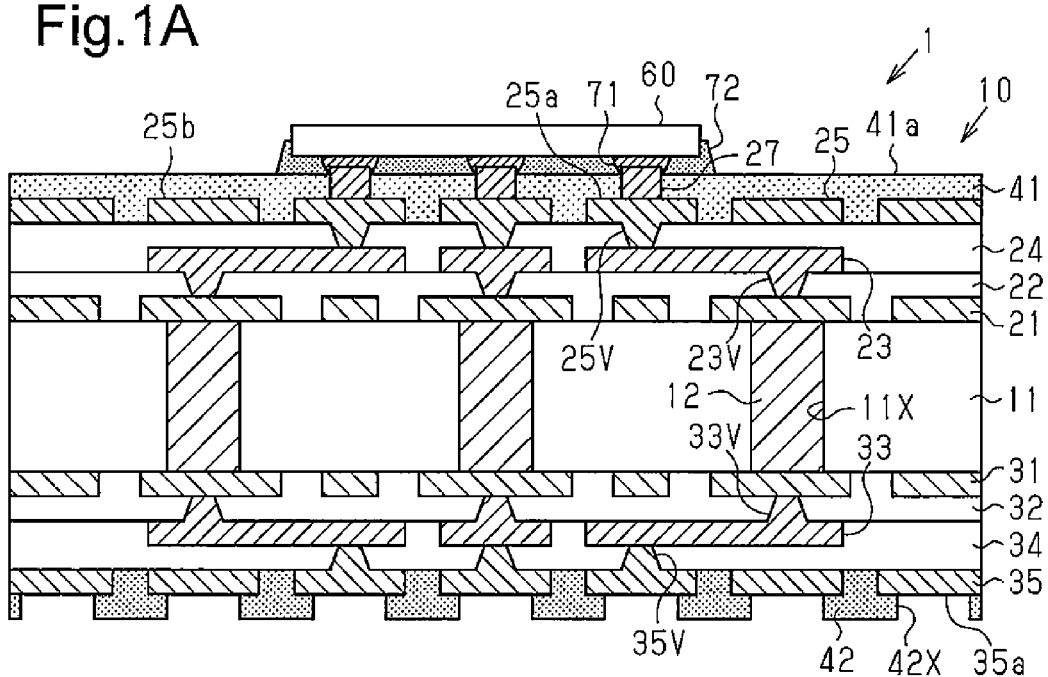
FIG. 1A is a schematic cross-section view of a semiconductor device.

Embodiments of a semiconductor device will now be described.

In the drawings, elements are illustrated for simplicity and clarity and have not necessarily been drawn to scale. To facilitate understanding, hatching lines may not be illustrated in the cross-sectional drawings.

As illustrated in FIG. 1A, a semiconductor device 1 includes a wiring substrate 10 and a semiconductor element 60, which is mounted on one surface (upper surface in the drawing) of the wiring substrate 10. The semiconductor device 1 is mounted on a substrate such as a motherboard.

In the present embodiment, for the sake of convenience, the side of the wiring substrate 10 on which the semiconductor element 60 is mounted is referred to as the upper side. Further, the surface on the upper side of each member in the wiring substrate 10 is referred to as the upper surface. The wiring substrate 10 may be reversed upside-down when used or be arranged at any angle. A plan view is a view of a subject taken in a direction normal to the surface on which the semiconductor element 60 is mounted. A plan view shape refers to a shape in a plan view.

The wiring substrate 10 includes a core substrate 11. The core substrate 11 is a glass epoxy substrate obtained by impregnating a glass cloth (glass fabric), which serves as a reinforcement material, with a thermosetting insulative resin of which the main component is an epoxy resin.

Through holes 11X extend through the core substrate 11 at predetermined locations between the upper surface and the lower surface. A through electrode 12 is formed in each through hole 11X extending through the core substrate 11 from the upper surface to the lower surface. The through electrode 12 may be formed from, for example, copper (Cu) or a copper alloy. The through electrode 12 may be formed by a plating film applied to the wall surface of the corresponding through hole 11X. The through electrode 12 in the through hole 11X may then be filled with an insulative resin.

A wiring layer 21, an insulation layer 22, a wiring layer 23, an insulation layer 24, and a wiring layer 25 are stacked in this order on the upper surface of the core substrate 11. A wiring layer 31, an insulation layer 32, a wiring layer 33, an insulation layer 34, and a wiring layer 35 are stacked in this order on the lower surface of the core substrate 11. The wiring layers 21, 23, and 25 and the wiring layers 31, 33, and 35 may be formed from copper or a copper alloy. The insulation layers 22 and 24 and the insulation layers 32 and 34 may be formed from, for example, an insulative resin such as an epoxy resin or a polyimide resin. Alternatively, the insulation layers 22 and 24 and the insulation layers 32 and 34 may be formed from a resin material obtained by mixing a filler such as silica or alumina to one of the above resins.

Wires in the wiring layer 21 on the upper surface of the core substrate 11 are electrically connected to corresponding wires in the wiring layer 31 on the lower surface of the core substrate 11.

At the upper side of the core substrate 11, vias 23V, which are formed in via holes of the insulation layer 22, electrically connect the wiring layer 23 to the wiring layer 21. In the same manner, vias 25V electrically connect the wiring layer 25 to the wiring layer 23.

The wiring layer 25, which is formed on the insulation layer 24, includes wires, which are patterned into predetermined shapes. Each of these wires will be described as the wiring layer 25. The wiring layer 25 includes a wiring layer 25a (first wiring layer), which is located inside a region corresponding to the semiconductor element 60 (mounting region), and a wiring layer 25b (second wiring layer), which is located outside the mounting region. Metal posts 27 are formed on the wiring layer 25a. More specifically, each metal post 27 is formed on one of the wires in the wiring layer 25a. The metal post 27 is, for example, cylindrical. The metal post 27 has an upper end 27c and a lower end 27d, which has a width (diameter) that is less than or equal to that of the upper end 27c. Accordingly, the side surface of the metal post 27 in the proximity of the upper end 27c is not projected sideward beyond the side surface of the metal post 27 in the proximity of the lower end 27d (proximal to where the metal post 27 is connected to the wiring layer 25a). The metal post 27 may be shaped to be a polygonal rod, such as a tetragonal or hexagonal rod. The metal post 27 is formed from, for example, copper (Cu). The metal post 27 may also be formed from, nickel, tin, silver, gold, palladium, aluminum, or an alloy of these metals. In the present embodiment, the metal posts 27 are not formed on the wiring layer 25b. The wiring layer 25b is used to connect, for example, the wiring layer 25a to the inner wiring layer 23. The wiring layers 25a and 25b may be described as the wiring layer 25 when not distinguished from each other.

A solder resist layer 41 covers the surfaces of the insulation layer 24 and the wiring layer 25, which are the outermost layers. Each metal post 27 projects from the upper surface 41a of the solder resist layer 41. Although not illustrated in the drawings, the surfaces (upper surfaces as viewed in the drawings) of the wiring layers 21, 23, and 25, the upper surface of the core substrate 11, the surfaces (upper surfaces as viewed in the drawings) of the insulation layers 22 and 24, and the upper end surfaces 27a of the metal posts 27 are roughened.

At the lower side of the core substrate 11, vias 33V, which are formed in via holes of the insulation layer 32, electrically connect the wiring layer 33 to the wiring layer 31. In the same manner, vias 35V electrically connect the wiring layer 35 to the wiring layer 33. A solder resist layer 42 covers the surfaces of the insulation layer 34 and the wiring layer 35, which are the outermost layers. Openings 42X extend through the solder resist layer 42 at predetermined locations. Each opening 42X exposes the wiring layer 35 as a pad 35a. Although not illustrated in the drawings, the surfaces (lower surfaces as viewed in the drawings) of the wiring layers 31, 33, and 35, the lower surface of the core substrate 11, and the surfaces (lower surfaces as viewed in the drawings) of insulation layers 32 and 34 are roughened.

A surface-processed layer may be applied to the surface of each pad 35a. The surface-processed layer may be a plating layer or an organic solderability preservative (OSP) film. The plating layer may be a plating film formed by stacking, for example, nickel and gold or nickel, palladium, and gold in this order. The OSP film may be a film formed from an imidazole compound or an azole compound.

Each metal post 27 of the wiring substrate 10 is connected to the semiconductor element 60 by solder 71. The semiconductor element 60 is flip-chip mounted on the wiring substrate 10. An underfill resin 72 fills the gap between the wiring substrate 10 and the semiconductor element 60. The underfill resin 72 may be, for example, an insulative resin such as an epoxy resin.

FIG. 1A illustrates one example of a wiring substrate. The wiring substrate only needs to include a structure that electrically connects the wiring layer 25 and the wiring layer 35 to each other. Thus, the number of wiring layers may be changed. Further, the wiring layers may be omitted. The wiring substrate may be, for example, a cored buildup substrate, which includes a core substrate, or a coreless substrate, which is less a core substrate.

Figure 1B:
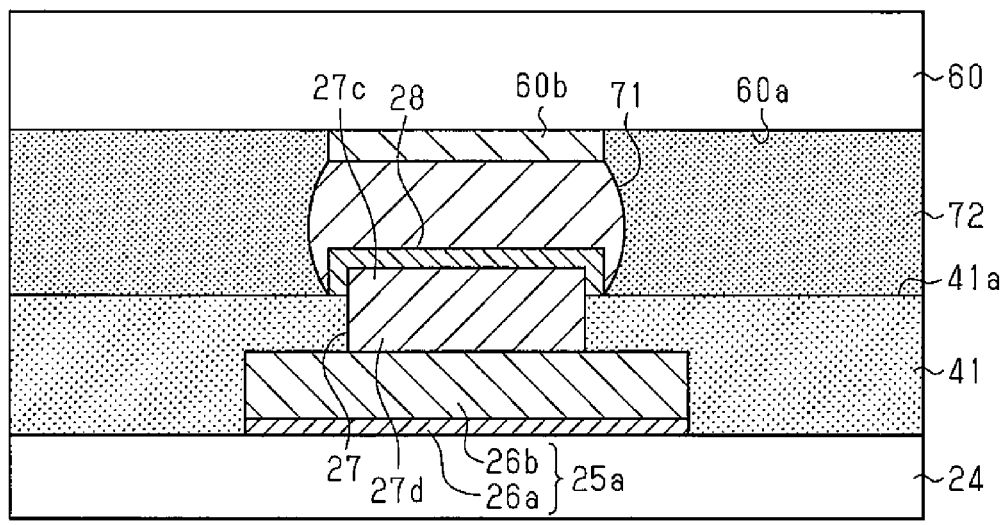
FIG. 1B is a partial cross-sectional view of a wiring substrate.

As illustrated in FIG. 1B, the wiring layer 25a includes a seed layer 26a, which is applied to the insulation layer 24, and a metal plating layer 26b, which is applied to the seed layer 26a. The seed layer 26a may be formed from copper or a copper alloy. The metal plating layer 26b may be formed from copper or a copper alloy. The seed layer 26a may be formed through, for example, a sputtering process or an electroless plating process. The metal plating layer 26b may be formed through, for example, an electrolytic plating process that uses the seed layer 26a as a power supplying layer. In the same manner as the metal plating layer 26b, the metal post 27 may be formed through, for example, an electrolytic plating process that uses the seed layer 26a as a power supplying layer.

A surface-processed layer 28 covers the upper end surface 27a and the side surface 27b of the upper end 27c of each metal post 27. The surface-processed layer 28 is, for example, a plating layer. The surface-processed layer 28 limits oxidation or the like of the surface of the metal post 27. The surface-processed layer 28 may be an OSP film that undergoes an OSP process. The OSP film may be a film formed from an imidazole compound or an azole compound.

The plating layer is formed from, for example, nickel (Ni), gold (Au), palladium (Pd), silver (Ag), or an alloy of these metals. The plating layer may be formed by a single layer or by multiple layers. For example, the plating layer may be a plating film formed by stacking an Ni or Ni alloy film and an Au or Au alloy film in this order. Alternatively, the plating film may be formed by stacking an Ni or Ni alloy film, a Pd or Pd alloy film, and an Au or Au alloy film; an Ni or Ni alloy film, a Pd or Pd alloy film, an Ag or Ag alloy film, and an Au or Au alloy film; an Ag or Ag alloy film; an Ni or Ni alloy film and an Ag or Ag alloy film; an Ni or Ni alloy film, a Pd or Pd alloy film, and an Ag or Ag alloy film.

The Ni or Ni alloy layer film in the plating layer preferably has a thickness of 0.5 μm or greater. The Au or Au alloy film and the Ag or Ag alloy film in the plating film each preferably have a thickness of 0.1 μm or greater. Further, the Pd or Pd alloy film in the plating film has a thickness of 0.005 μm or greater.

The semiconductor element 60 has a circuit formation surface 60a (lower surface in FIG. 1B) including pads 60b. Each pad 60b is connected to the corresponding metal post 27 of the wiring substrate 10 by the solder 71. The solder 71 is, for example, a solder bump formed on a pad of the semiconductor element 60. The solder bump is formed by, for example, forming a micro-ball or applying a solder paste to the pad of the semiconductor element 60. The bump only needs to be formed on at least one of the semiconductor element 60 or the wiring substrate 10.

The metal posts 27 are arranged in a matrix array in correspondence with the pads 60b of the semiconductor element 60. The metal posts 27 are laid out at a pitch (post pitch) of 40 to 200 μm (e.g., 150 μm). Each metal post 27 has a diameter (post diameter) of 20 to 150 μm (e.g., 90 μm) and a height (projection amount from upper surface 41a of solder resist layer 41, post height) of 1 to 50 μm (e.g., 10 μm). The wiring layer 25a has a thickness of 5 to 20 μm (e.g., 15 μm). The solder resist layer 41 has a thickness (thickness from wiring layer 25a to upper surface 41a of solder resist layer 41) of 5 μm or greater (e.g., 10 μm).

Figure 1C:
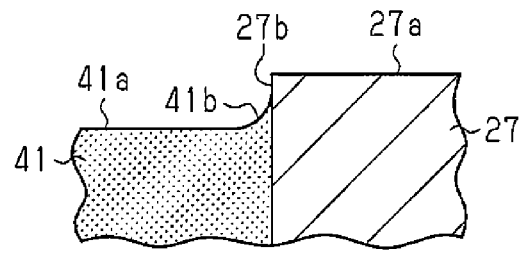
FIG. 1C is a partial cross-sectional view of a post and a resist film.

As illustrated in FIG. 1C, the solder resist layer 41 includes a fillet 41b that contacts the side surface 27b of each metal post 27 and extends from the upper surface 41a of the solder resist layer 41 toward the upper end surface 27a of the metal post 27. Thus, the fillet 41b covers the side surface 27b of each metal post 27. The fillet 41b has, for example, a curved cross-section. The fillet 41b reduces the formation of voids and residues. When forming a metal post in each opening of the solder resist layer 41, the upper surface 41a of the solder resist layer 41 extends at a right angle to the side surface 27b of the metal post 27. This may form a right-angle corner between the upper surface 41a of the solder resist layer 41 and the side surface 27b of the metal post 27. When the underfill resin 72 is applied, the right-angle corner may form voids of air in the underfill resin 72. Further, the right-angle corner may result in residual chemical agents when the wiring substrate 10 undergoes washing or surface-processing.

The formation of the wiring layer 25a and the metal posts 27 on the wiring substrate 10 will now be described.

First, the wiring layer 25a illustrated in FIG. 1A is patterned.

Figure 2A:
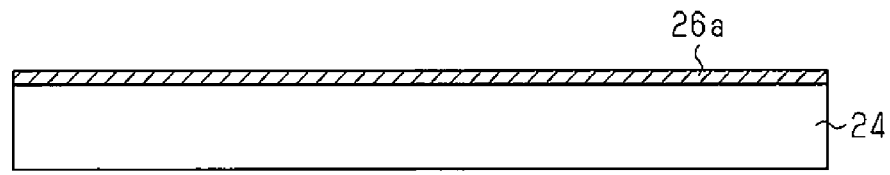
FIGS. 2A to 2E are cross-sectional views illustrating procedures for manufacturing a wiring substrate (post)

As illustrated in FIG. 2A, the seed layer 26a is formed covering the entire surface (upper surface) of the insulation layer 24. For example, an electroless copper plating process or a copper sputtering process is performed to form the seed layer 26a.

Figure 2B:
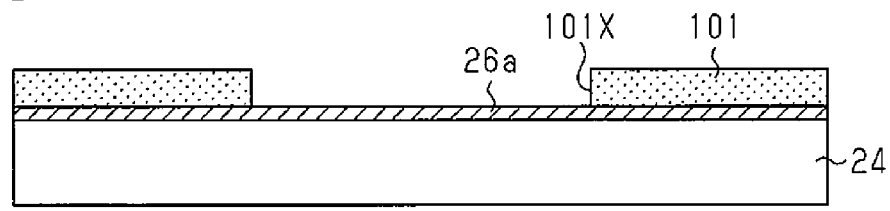

Then, as illustrated in FIG. 2B, a plating resist layer 101, which includes openings 101X at predetermined locations, is formed on the seed layer 26a. The openings 101X expose the seed layer 26a at portions (regions) corresponding to the wiring layer 25a illustrated in FIG. 1A. The plating resist layer 101 is formed from a material having plating resistance. For example, the plating resist layer 101 may be formed from a photosensitive dry film resist or a liquid photo resist (e.g., dry film resist or liquid resist of a novolac resin or an acrylic resin). For example, when using a photosensitive dry film resist, thermocompression bonding is performed to laminate a dry film to the upper surface of the seed layer 26a. Then, a photolithography process is performed to pattern the dry film and form the plating resist layer 101 that includes the openings 101X. Similar steps are performed when using a liquid photo resist to form the plating resist layer 101.

Then, the metal posts 27 illustrated in FIG. 1A are formed.

Figure 2C:
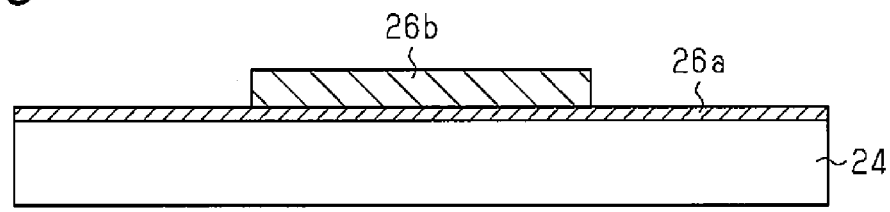

Referring to FIG. 2C, an electrolytic plating process is performed using the plating resist layer 101 as a plating mask and the seed layer 26a as a power supplying layer to form the metal plating layer 26b in the openings 101X of the plating resist layer 101 on the upper surface of the seed layer 26a. Then, for example, a defoliation process is performed to remove the plating resist layer 101.

Figure 2D:
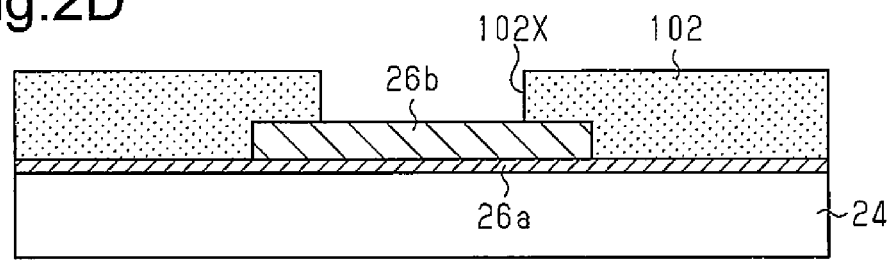

Referring to FIG. 2D, a plating resist layer 102 including openings 102X at predetermined locations is formed on the seed layer 26a and the metal plating layer 26b. The openings 102X are formed to expose the wiring layer 25a (metal plating layer 26b) at portions (regions) corresponding to the metal posts 27 illustrated in FIG. 1A. In the same manner as the plating resist layer 101, the plating resist layer 102 may be formed from a material having plating resistance, for example, a photosensitive dry film resist or a liquid photo resist (e.g., dry film resist or liquid resist of a novolac resin or an acrylic resin).

Figure 2E:
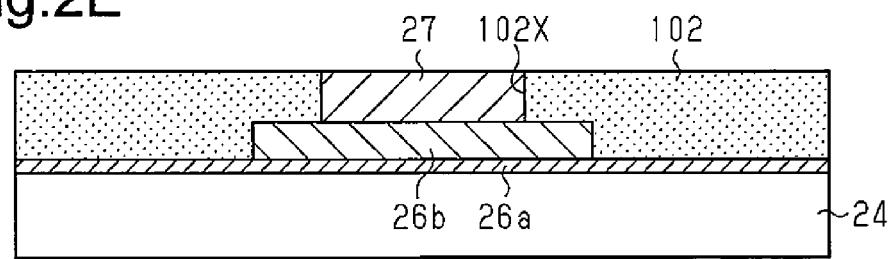

Referring to FIG. 2E, an electrolytic copper plating process is performed using the plating resist layer 102 as a plating mask and the seed layer 26a as a power supplying layer to form the metal posts 27 in the openings 102X of the plating resist layer 102 on the upper surface of the metal plating layer 26b.

Figure 3A:
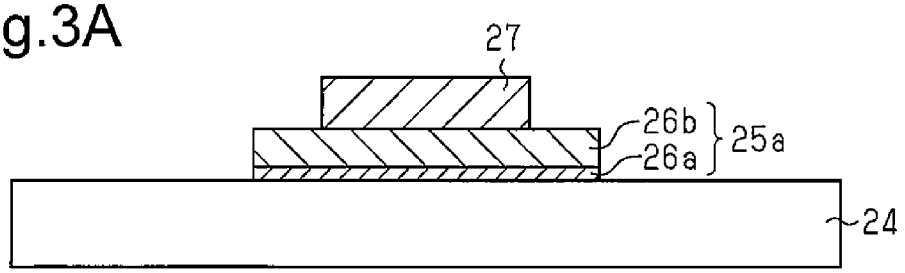
FIGS. 3A to 3E are cross-sectional views illustrating procedures for manufacturing the wiring substrate (post)

Referring to FIG. 3A, for example, a defoliation process is performed to remove the plating resist layer 102. Further, flash etching is performed to remove portions of the seed layer 26a exposed from the metal plating layer 26b. This obtains the wiring layer 25a, which includes the seed layer 26a and the metal plating layer 26b, and the metal posts 27, which are located on the wiring layer 25a.

Then, the solder resist layer 41 illustrated in FIG. 1A is formed.

The surface of the structure illustrated in FIG. 3A (surfaces of wiring layer 25a and metal posts 27) undergoes a roughening process. The roughening process may be, for example, an etching process, a CZ process, a black oxide process (oxidation process), or a blasting process. The CZ process performs an etching process with a formic acid solution. The black oxide process (oxidation process) performs an oxidation process with a solution of sodium chlorite, sodium hydroxide, sodium phosphate, or the like. The roughening process roughens the surfaces of the wiring layer 25a and the metal posts 27.

The surfaces of the wiring layer 25a and the metal posts 27 have a roughness indicated by a surface roughness Ra value that is in the range of, for example, 100 to 500 μm (e.g., 350 μm). Due to the roughening process described above, the roughness of the side surfaces of the wiring layer 25a and the upper surface of the wiring layer 25a exposed from the metal posts 27 has a greater roughness than the surface where the wiring layer 25a and the metal posts 27 are coupled.

Figure 3B:
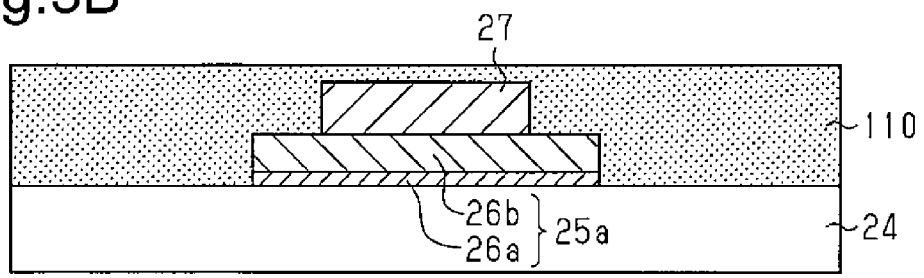

Referring to FIG. 3B, a resin layer 110 is formed covering the wiring layer 25a and the metal posts 27. The resin layer 110 is used to form the solder resist layer 41 illustrated in FIG. 1A. The resin layer 110 may be formed from an insulative resin such as an epoxy resin. The resin layer 110 is formed by stacking a semi-cured resin film on the structure illustrated in FIG. 3A. A printing process or a spin coating process may be performed to form the resin layer 110 using a liquid or paste of an insulation resin. Then, the upper surface 110a of the resin layer 110 is flattened. For example, a pressing machine is used to press the resin layer 110 and flatten the upper surface 110a.

Figure 3C:
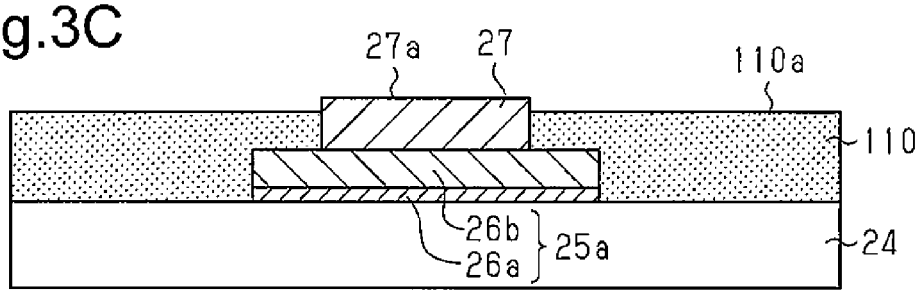

Referring to FIG. 3C, a thinning process is performed on the resin layer 110. The thinning process roughens the surface of the resin layer 110. The thinning process may be dry blasting, wet blasting, dissolution using an alkali solution, or the like. The thinning process performed on the resin layer 110 exposes the upper end surface 27a of each metal post 27. The projection amount of each metal post 27 may be controlled by the processing time of the thinning process. The thinning process forms the fillet 41b illustrated in FIG. 1C.

Figure 3D:
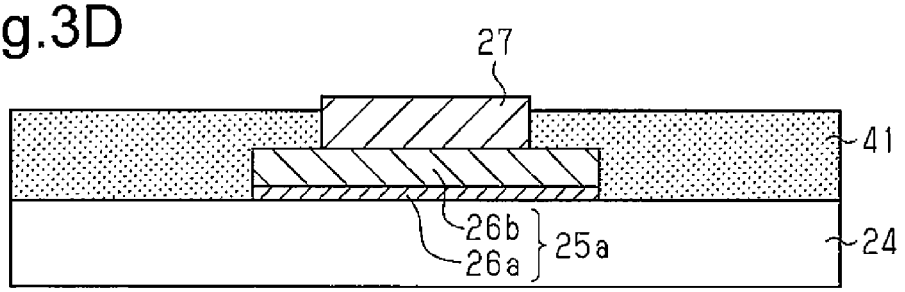

Referring to FIG. 3D, the solder resist layer 41 is formed. The solder resist layer 41 is obtained by irradiating the resin layer 110 with ultraviolet (UV) light and performing a heating process to harden the resin layer 110. The roughness of the surface of the solder resist layer 41 (i.e., roughness of surface of hardened resin layer 110) is indicated by a surface roughness Ra value that is in the range of, for example, 50 to 200 μm (e.g., 100 μm).

Then, surface-processing is performed.

Figure 3E:
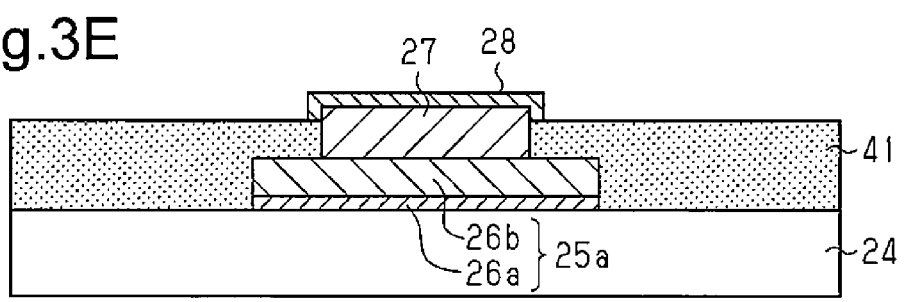

Referring to FIG. 3E, a process for removing resin residues from the surface of each metal post 27 is performed. The removal process may be, for example, a plasma process, a blasting process, or an etching process. In the etching process, etching may be performed with a permanganate solution. Then, the surface-processed layer 28 is formed covering the surface of each metal post 27. For example, electroless plating process or an electrolytic plating process may be performed to form the surface-processed layer 28.

The operation of the wiring substrate 10 will now be described.

A conventional method for forming metal posts will first be described.

In the conventional method, a solder resist layer is formed, and openings that expose the upper surface of an outermost wiring layer are formed in the solder resist layer. A seed layer is formed in the solder resist layer. A plating resist layer including openings at predetermined locations covers the seed layer. Electrolytic copper plating is performed using the seed layer as a power supplying layer to form metal posts in the openings of the plating resist layer. In such a method, each metal post may be larger than the corresponding opening in the solder resist layer due to the alignment accuracy of the plating resist layer relative to the solder resist layer. Further, the metal posts may be displaced due to the alignment accuracy of the solder resist layer and the plating resist layer. Additionally, the residues of the seed layer on the upper surface of the solder resist layer may cause a failure such as a short-circuit.

In the wiring substrate 10 of the present embodiment, after the metal posts 27 are formed on the wiring layer 25a, the resin layer 110, which covers the metal posts 27, is thinned to form the solder resist layer 41. Thus, the metal posts 27 may be accurately formed regardless of the positioning accuracy of the solder resist layer 41. Further, each metal post 27 is cylindrical and has a smaller upper surface than that of the metal post formed through the conventional method. This allows the metal post 27 to have a small diameter and be applicable to a semiconductor element having a narrowed pitch.

Further, the solder resist layer 41 is formed after the removal of the unnecessary seed layer 26a. Thus, the upper surface 41a of the solder resist layer 41 is free of residues. This limits the occurrence of a failure such as a short-circuit.

The present embodiment has the advantages described below.

(1) The wiring substrate 10, on which the semiconductor element 60 is mounted, includes the wiring layer 25a and the metal posts 27, which are formed on the wiring layer 25a. The wiring layer 25a is covered by the solder resist layer 41, and the upper ends 27c of the metal posts 27 project from the upper surface 41a of the solder resist layer 41. Each metal post 27 is connected by the solder 71 to the corresponding connection terminal (pad 60b) of the face-down-mounted semiconductor element 60. If the upper end surface 27a of the metal post 27 were to be lower than the upper surface 41a of the solder resist layer 41, the height of a bump or the like for the solder 71 would have to be increased. However, when increasing the height of the bump for solder or the like, short-circuiting may occur due to contact with an adjacent bump. Accordingly, the projection of the metal posts 27 from the upper surface 41a of the solder resist layer 41 allows the semiconductor element 60 to be mounted without enlarging bumps that are used to connect the semiconductor element. This allows for the mounting of the semiconductor element 60 including the pads 60b that are arranged at a narrow pitch.

(2) The wiring layer 25a includes the seed layer 26a, which is formed on the insulation layer 24, and the metal plating layer 26b, which is formed on the seed layer 26a and has the same shape as the seed layer 26a in a plan view. An electrolytic copper plating process using the seed layer 26a as a power supplying layer is performed to form the metal plating layer 26b. Further, an electrolytic copper plating process using the seed layer 26a as a power supplying layer is performed to form the metal posts 27 on the wiring layer 25a. Then, the metal plating layer 26b is used as a mask to remove unnecessary portions from the seed layer 26a. The removal of unnecessary portions from the seed layer 26a after the formation of the metal posts 27 avoids connection of the wiring layer 25a and the metal posts 27 with other wiring layers. That is, the wiring layer 25a and the metal posts 27 are electrically isolated. The wiring layer 25a and the metal posts 27 that are electrically isolated in this manner may be set as a non-connected terminal (NC terminal). The formation of the electrically connected wiring layer 25a and metal posts 27 increases the number of connections between the wiring substrate 10 and the semiconductor element 60 as compared with when using only metal posts 27 that are electrically connected. This allows for stable mounting of the semiconductor element 60.

(3) The upper ends 27c of the metal posts 27 project from the upper surface 41a of the solder resist layer 41. This obtains a standoff without enlarging bumps used for connection to the semiconductor element 60. The standoff obtained in this manner facilitates the formation of the underfill resin 72 and reduces failures such as wire breakage between the semiconductor element 60 and the wiring substrate 10 or separation of the semiconductor element 60.

(4) When manufacturing the wiring substrate 10, the metal posts 27 are formed in the openings 102X of the plating resist layer 102 that covers the seed layer 26a and the metal plating layer 26b. Then, after thinning the resin layer 110, which covers the metal posts 27, the resin layer 110 is hardened to form the solder resist layer 41. In the conventional method, a seed layer is formed on the solder resist layer 41, and metal posts are formed in openings of a resist layer that covers the seed layer. In this case, each metal post may be larger than the corresponding opening in the solder resist layer due to the alignment accuracy of the plating resist layer relative to the solder resist layer. Further, the metal posts may be displaced due to the alignment accuracy of the plating resist layer relative to the solder resist layer. In the present embodiment, after the metal posts 27 are formed on the wiring layer 25a, the resin layer 110, which covers the metal posts 27, is thinned to form the solder resist layer 41. Thus, the metal posts 27 may be accurately formed regardless of the positioning accuracy of the solder resist layer 41. Further, each metal post 27 is cylindrical and has a smaller upper end surface 27a than that of the metal post formed through the conventional method. This allows the metal post 27 to have a small diameter and be applicable to a semiconductor element having a narrowed pitch.

(5) When manufacturing the wiring substrate 10, the solder resist layer 41 is formed after the seed layer 26a, the metal plating layer 26b, and the metal posts 27 are formed. In the related art, the outermost wiring layer is formed in the openings of the solder resist layer. However, this would form residues of the seed layer on the upper surface of the solder resist layer that may cause a failure such as a short-circuit. In this respect, the present embodiment forms the solder resist layer 41 after the unnecessary seed layer 26a is removed. Thus, residues are not left on the upper surface 41a of the solder resist layer 41. This limits the occurrence of failures such as short-circuits.

(6) The metal posts 27 are covered by the resin layer 110, and the resin layer 110 is thinned and hardened to form the solder resist layer 41. Thus, the solder resist layer 41 includes the fillet 41b extending toward the upper end surface 27a of each metal post 27 from the upper surface 41a to the side surface 27b of the metal post 27. The fillet 41b limits the formation of voids in the underfill resin 72. This limits cracking and defoliation of the underfill resin 72 and stably fixes the semiconductor element 60. Further, the fillet 41b reduces residual chemical agents when the wiring substrate 10 undergoes washing or surface-processing.

(7) The surfaces of the metal posts 27 and the wiring layer 25a are roughened to improve the adhesiveness of the solder resist layer 41 with the metal posts 27 and the wiring layer 25a. This limits, for example, defoliation of the solder resist layer 41 from the side surfaces of the metal posts 27. Defoliation of the solder resist layer 41 from the side surfaces of the metal posts 27 may result in corrosion of the lower ends 27d of the metal posts 27 or the wiring layer 25a. Accordingly, when defoliation is limited, corrosion may be limited. This improves the electrical reliability.

(8) The surface of the solder resist layer 41 is roughened to improve the wettability and adhesiveness of the underfill resin 72 and the solder resist layer 41 when mounting the semiconductor element 60. This improves the connection reliability of the semiconductor element 60.

(9) The upper end surface 27a and the side surface 27b of each metal post 27 that are exposed from the solder resist layer 41 are covered by the surface-processed layer 28. This improves the corrosion resistance of the metal post 27. As a result, the connection reliability of the semiconductor element 60 is improved.

It should be apparent to those skilled in the art that the present disclosure may be embodied in many other specific forms without departing from the spirit or scope of the disclosure. Particularly, it should be understood that the present disclosure may be embodied in the following forms.

In the above embodiment, the semiconductor element 60, which serves as an electronic component, is mounted on the wiring substrate 10. However, another wiring substrate or a semiconductor module (semiconductor package) including a semiconductor element may be mounted on the wiring substrate 10. That is, the metal posts 27 may be used to mount another wiring substrate or a semiconductor module (semiconductor package).

In the above embodiment, shapes may be changed and components may be added.

For example, referring to FIG. 4A, the solder resist layer 41 may include openings 41X. For example, a photolithography process may be performed on the resin layer 110 illustrated in FIG. 3C to form the openings 41X. For example, a photosensitive resin layer 110 is formed, and the resin layer 110 is exposed and developed to form the openings 41X.

The openings 41X expose the upper portion 24a of the insulation layer 24. The openings 41X are effective when, for example, cutting the wiring substrate. When a wiring substrate includes a batch of the wiring substrates, the formation of corners in accordance with the plan view shape of the singulated wiring substrates 10 allows the cutting locations indicated by the broken line to be easily found. Further, the adhesion of the solder resist layer 41 to a tool used for cutting is reduced.

Referring to FIG. 4B, openings 41Y may be formed to expose the upper surface of the wiring layer 25. The surface of the wiring layer 25 exposed from the openings may be used as a positioning mark (alignment mark) or be marked to indicate the type or serial number of the wiring substrate 10.

The portions of the wiring layer 25 exposed from the opening 41Y may be used as connection pads.

Figure 5:
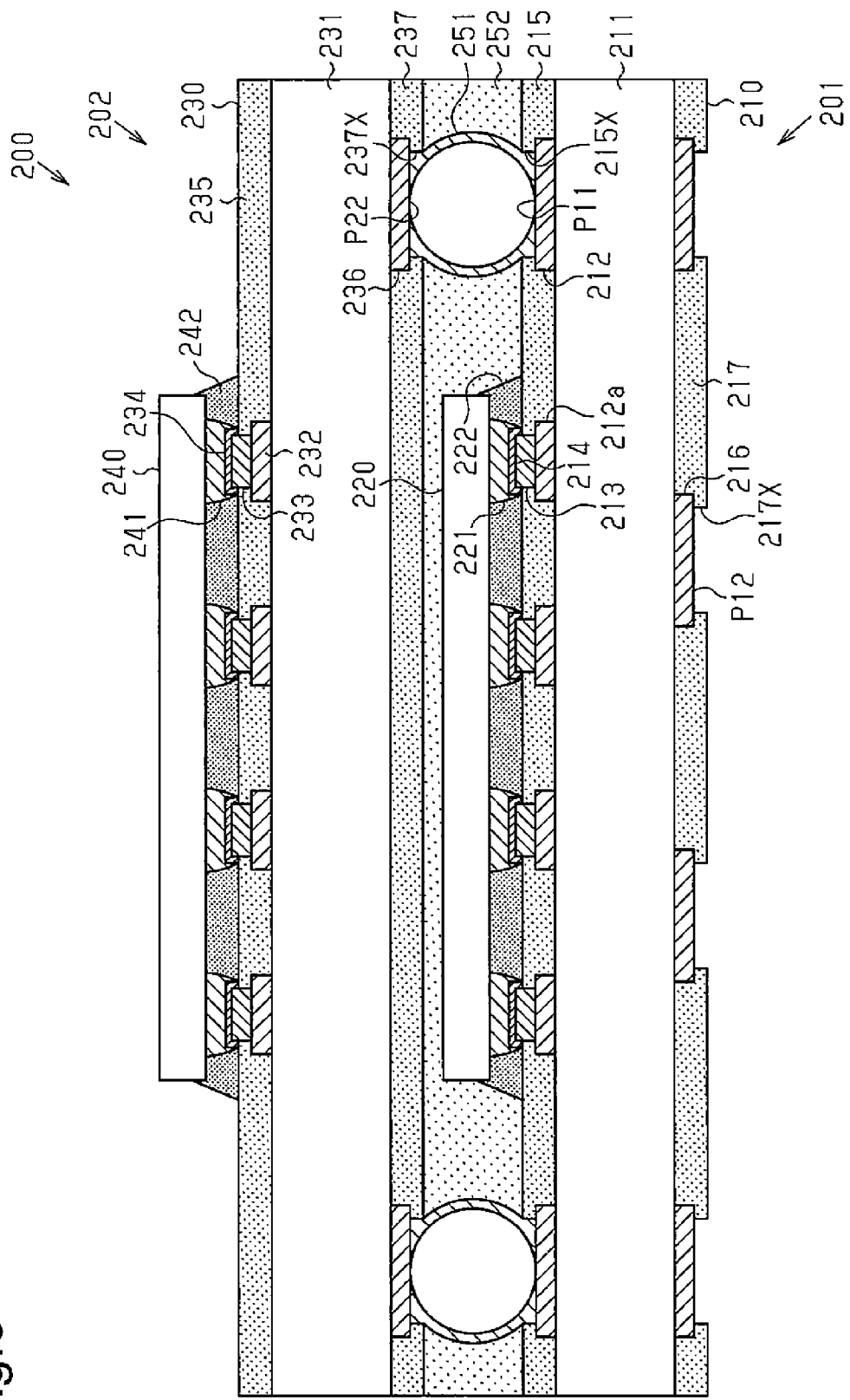
FIG. 5 is a schematic cross-sectional view of another semiconductor device.

More specifically, as illustrated in FIG. 5, a semiconductor device 200 includes a plurality of (two in FIG. 5) stacked semiconductor packages (semiconductor devices) 201 and 202. The semiconductor device 200 is a Package on Package (PoP) product.

The semiconductor package 201 includes a wiring substrate 210 and a semiconductor element 220. The wiring substrate 210 is formed in the same manner as the wiring substrate 10. In detail, the wiring substrate 210 includes a substrate body 211, wiring layers 212, 212a, and 216, metal posts 213, a surface-processed layer 214, and solder resist layers 215 and 217. The substrate body 211 includes a member that electrically connects the wiring layers 212 and 212a on the upper surface to the wiring layers 216 on the lower surface. Thus, wiring layers similar to those of the wiring substrate 10 illustrated in FIG. 1A may be formed in the substrate body 211 if necessary. The substrate body 211 may be, for example, a cored buildup substrate, which includes a core substrate, or a coreless substrate, which is less a core substrate.

In the same manner as the wiring layer 25a illustrated in FIG. 1B, the wiring layers 212 and 212a include a seed layer and a metal plating layer. The metal posts 213 are formed on the wiring layer 212a. The solder resist layer 215 covers the upper surface of the substrate body 211. Each metal post 213 includes an upper end 27c that projects from the solder resist layer 215. The surface-processed layer 214 is formed on the surface of each metal post 213. The surface-processed layer 214 may be, for example, a plating layer or an OSP film like the surface-processed layer 28. The surface-processed layer 214 does not necessarily have to be formed.

Each metal post 213 is connected by solder 221 to a pad of the semiconductor element 220. An underfill resin 222 is formed between the wiring substrate 210 and the semiconductor element 220.

The solder resist layer 215 includes openings 215X exposing portions of the wiring layer 212 as pads P11. The pads P11 are used for connection with the semiconductor package 202.

The solder resist layer 217 covers the lower surface of the substrate body 211. The solder resist layer 217 includes openings 217X exposing portions of the wiring layer 216 as pads P12. The pads P12 are used when mounting the semiconductor device 200 on a substrate such as a motherboard.

Like the semiconductor package 201, the semiconductor package 202 includes the wiring substrate 230 and the semiconductor element 240. Like the wiring substrate 210, the wiring substrate 230 includes a substrate body 231, wiring layers 232 and 236, metal posts 233, a surface-processed layer 234, and solder resist layers 235 and 237. The substrate body 231 includes a member that electrically connects the wiring layer 232 on the upper surface and the wiring layer 236 on the lower surface. Wiring layers similar to those of the wiring substrate 10 illustrated in FIG. 1A may be formed in the substrate body 231 if necessary. The substrate body 231 may be, for example, a cored buildup substrate, which includes a core substrate, or a coreless substrate, which is less a core substrate.

In the same manner as the wiring layer 25a illustrated in FIG. 1B, the wiring layer 232 includes a seed layer and a metal plating layer. The metal posts 233 are formed on the wiring layer 232. The solder resist layer 235 covers the upper surface of the substrate body 231. Each metal post 233 includes an upper end that projects from the solder resist layer 235. The surface-processed layer 234 is formed on the surface of each metal post 233. The surface-processed layer 234 may be, for example, a plating layer or an OSP film like the surface-processed layer 28. The surface-processed layer 234 does not necessarily have to be formed.

Each metal post 233 is connected by solder 241 to a pad of the semiconductor element 240. An underfill resin 242 is formed between the wiring substrate 230 and the semiconductor element 240.

The solder resist layer 237 covers the lower surface of the substrate body 231. The solder resist layer 237 includes openings 237X exposing portions of the wiring layer 236 as pads P22. The pads P22 are used when connecting the semiconductor package 202 to the semiconductor package 201.

Solder balls 251 electrically connect the pads P11 of the wiring substrate 210 to the pads P22 of the wiring substrate 230. Each solder ball 251 is, for example, a metal core solder ball. The metal is, for example, copper. The solder ball 251 may include a resin core instead of a metal core.

The space between the wiring substrate 210 and the wiring substrate 230 is filled with a resin 252. The resin 252 protects the portion where the wiring substrates 210 and 230 are connected. The resin 252 increases the strength connecting the wiring substrate 210 and the wiring substrate 230. The resin 252 may be an insulative resin, such as an epoxy resin or a polyimide resin, or an insulative resin mixed with a filler such as silica ($SiO_2$).

In the wiring substrate 210, each metal post 213 may have a diameter of 50 to 300 μm (e.g., 75 μm). Further, each metal post 213 may have a height (projection amount from solder resist layer 215) of 50 to 200 μm (e.g., 100 μm).

A wire may be formed between two portions of the wiring layer 25a illustrated in FIG. 1A.

Figure 6A:
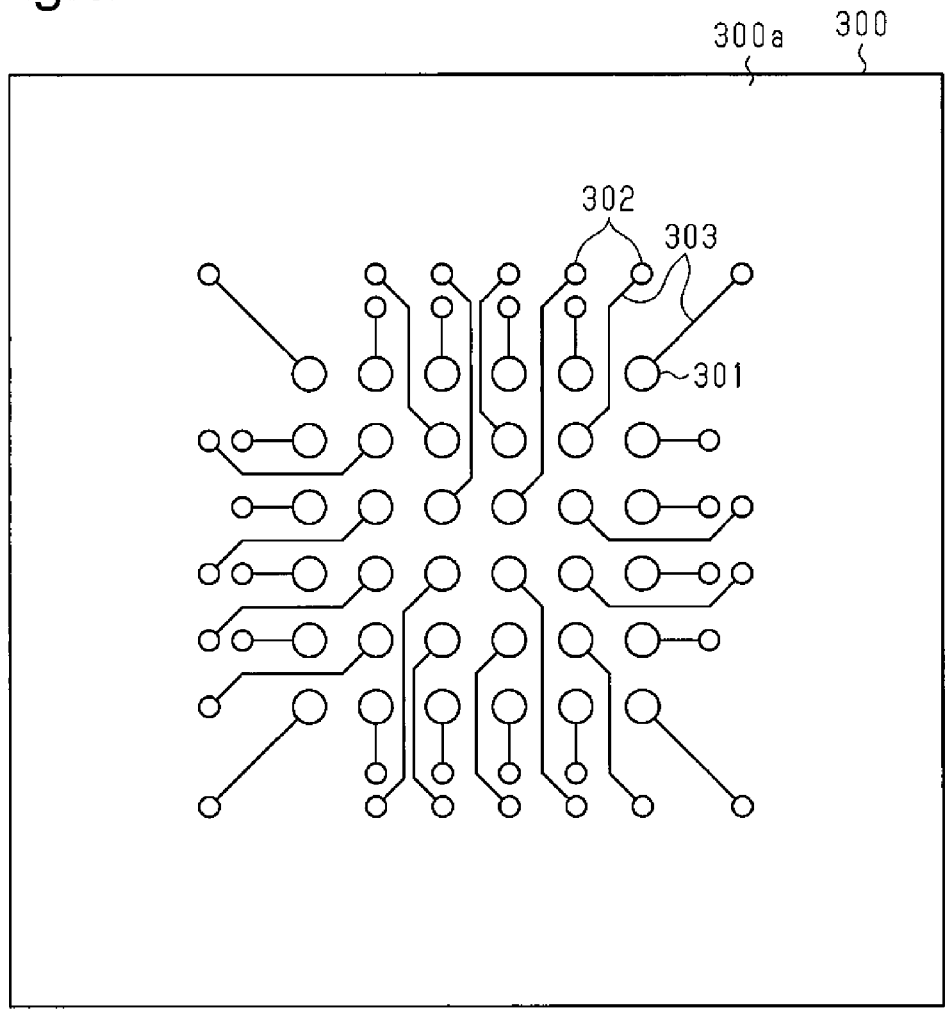
FIG. 6A is a schematic plan view of a further wiring substrate.

For example, as illustrated in FIG. 6A, metal posts 301 are arranged on an upper surface 300a of a wiring substrate 300 (surface on which semiconductor element is mounted). The metal posts 301 are laid out in a matrix array in a plan view and respectively connected to pads of a semiconductor element in accordance with the layout of the pads. The metal posts 301 are formed in the same manner as the metal posts 27.

The wiring substrate 300 includes wires 303 extending from the metal posts 301 to the through holes 302 located at an outer side of a region where the metal posts 301 are formed. The wires 303 extend between the metal posts 301 in the matrix array. A solder resist layer 305 (refer to FIG. 6B) of the wiring substrate 300 covers the wires 303 and the through holes 302. To facilitate understanding, the through holes 302 and the wires 303 are illustrated by solid lines in FIG. 6A.

Figure 6B:
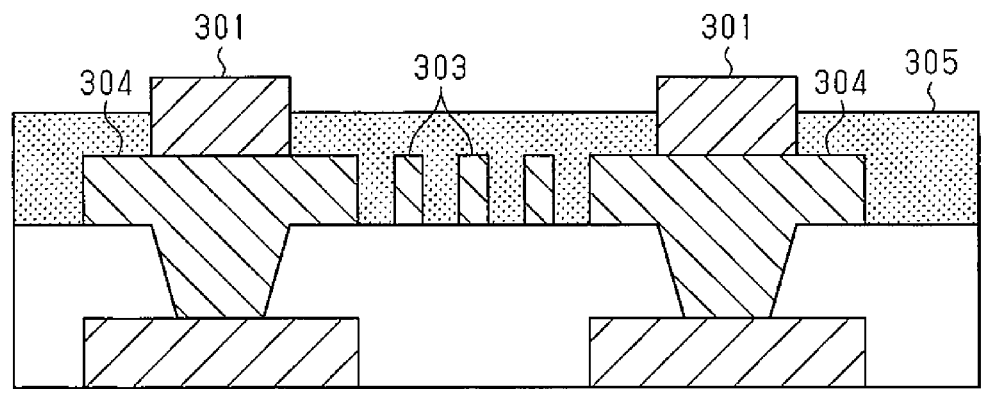
FIG. 6B is a partial cross-sectional view of the further wiring substrate.

As illustrated in FIG. 6B, the wires 303 are formed between portions of the wiring layer 304 where the metal posts 301 are connected. In the same manner as the wiring layer 25a, the wiring layer 304 includes a seed layer and a metal plating layer. Each wire 303 is formed in the same manner as the wiring layer 304 (wiring layer 25a).

The metal posts 301, which are formed in the same manner as the above embodiment, are shaped and positioned with high accuracy. Accordingly, the wiring layer 304, on which the metal posts are formed, may have a size allowing for connection of metal posts. Thus, as described above, the wires 303 may be formed between two adjacent portions of the wiring layer 304. The wires 303 decrease the number of stacked wiring layers and insulation layers in the wiring substrate 300 as compared with a wiring substrate that does not include such wires. This allows the wiring substrate 300 to be reduced in thickness and manufactured more quickly and less costly.

Clauses

This disclosure further encompasses various embodiments described below.

1. A method for manufacturing a wiring substrate including a metal post for an electronic component, the method including:
   forming a seed layer on an insulation layer;
   forming a first resist layer that covers the seed layer and includes an opening at a predetermined location;
   forming a metal plating layer in the opening of the first resist layer using the seed layer as a power supplying layer;
   removing the first resist layer;
   forming a second resist layer that covers the seed layer and the metal plating layer, wherein the second resist layer includes an opening that exposes a portion of an upper surface of the metal plating layer;
   forming the metal post in the opening of the second resist layer using the seed layer as a power supplying layer;
   removing the second resist layer;
   etching the seed layer using the metal plating layer as a mask;
   forming a resin layer that covers the metal post; and
   thinning the resin layer and exposing an upper end of the metal post.

2. The method according to clause 1, further including forming an opening in the resin layer after the thinning of the resin layer.

The present examples and embodiments are to be considered as illustrative and not restrictive, and the disclosure is not to be limited to the details given herein, but may be modified within the scope and equivalence of the appended claims.

The invention claimed is:

1. A wiring substrate comprising:
   a wiring layer;
   metal posts arranged on the wiring layer, wherein the metal posts are used to mount an electronic component; and
   a protective layer that covers a surface of the wiring layer on which the metal posts are arranged;
   wherein the wiring layer includes a seed layer and a metal plating layer formed on the seed layer, wherein the metal plating layer has a size that is the same as a size of the seed layer in a plan view;
   the metal posts each include an upper end, which projects from the protective layer, and a lower end, which is buried in the protective layer and has a width that is the same as or greater than a width of the upper end; and
   the protective layer includes a fillet for each of the metal posts, wherein the fillet extends toward an upper end surface of a corresponding one of the metal posts and contacts a side surface of the corresponding one of the metal posts,
   wherein each of the metal posts has a cylindrical shape or a polygonal rod shape, surfaces of the wiring layer and the surfaces of the metal posts are roughened, the roughened surfaces of the wiring layer and the surfaces of the metal posts have a greater roughness than the surface of the wiring layer on which the metal posts are arranged.

2. The wiring substrate according to claim 1, further comprising a surface-processed layer that covers the upper end surface of each of the metal posts.

3. The wiring substrate according to claim 1, wherein a roughness of the roughened surfaces of the wiring layer and the surfaces of the metal posts is in the range of 100 to 500 µm.

4. The wiring substrate according to claim 1, wherein each of the metal posts is a plated metal and is coupled to an upper surface of the metal plating layer.

5. The wiring substrate according to claim 1, wherein the wiring layer includes two adjacent portions, on which two metal posts of the metal posts are respectively arranged, and a wire that is formed between the two adjacent portions of the wiring layer.

6. The wiring substrate according to claim 1, wherein:

the wiring layer is a first one of a plurality of wiring layers; and the first wiring layer includes a first wire that is connected to a second one of the plurality of wiring layers, and a second wire that is not connected to the second wiring layer.

7. A wiring substrate comprising:

a wiring layer;

metal posts arranged on the wiring layer, wherein the metal posts are used to mount an electronic component; and a protective layer that covers a surface of the wiring layer on which the metal posts are arranged;

wherein the wiring layer includes a seed layer and a metal plating layer formed on the seed layer, wherein the metal plating layer has a size that is the same as a size of the seed layer in a plan view;

the metal posts each include an upper end, which projects from the protective layer, and a lower end, which is buried in the protective layer and has a width that is the same as or greater than a width of the upper end; and the protective layer includes a fillet for each of the metal posts, wherein the fillet extends toward an upper end surface of a corresponding one of the metal posts and contacts a side surface of the corresponding one of the metal posts, the wiring substrate further comprising an insulation layer formed on a surface of the wiring layer opposite to the surface on which the metal posts are arranged, wherein the protective layer includes an opening that exposes a portion of an upper surface of the insulation layer.

8. The wiring substrate according to claim 7, further comprising a surface-processed layer that covers the upper end surface of each of the metal posts.

9. The wiring substrate according to claim 7, wherein a surface of each of the metal posts is roughened.

10. The wiring substrate according to claim 7, wherein:

the wiring substrate includes a batch of singulated wiring substrates; and the opening is positioned at a corner of each of the singulated wiring substrates.

11. The wiring substrate according to claim 7, wherein:

the wiring substrate includes a batch of singulated wiring substrates; and the opening is positioned at a cutting location between two adjacent singulated wiring substrates of the singulated wiring substrates.

12. A wiring substrate comprising:

a wiring layer;

metal posts arranged on the wiring layer, wherein the metal posts are used to mount an electronic component; and a protective layer that covers a surface of the wiring layer on which the metal posts are arranged;

wherein the wiring layer includes a seed layer and a metal plating layer formed on the seed layer, wherein the metal plating layer has a size that is the same as a size of the seed layer in a plan view;

the metal posts each include an upper end, which projects from the protective layer, and a lower end, which is buried in the protective layer and has a width that is the same as or greater than a width of the upper end; and the protective layer includes a fillet for each of the metal posts, wherein the fillet extends toward an upper end surface of a corresponding one of the metal posts and contacts a side surface of the corresponding one of the metal posts, wherein:

the wiring layer includes a first wire, on which the metal posts are arranged, and a second wire that is free from the metal posts; and the protective layer includes an opening that exposes a portion of an upper surface of the second wire.

13. The wiring substrate according to claim 12, further comprising a surface-processed layer that covers the upper end surface of each of the metal posts.

14. The wiring substrate according to claim 12, wherein a surface of each of the metal posts is roughened.

15. The wiring substrate according to claim 12, wherein the portion of the upper surface of the second wire functions as a connection pad.

16. The wiring substrate according to claim 12, wherein the portion of the upper surface of the second wire has one or more of an alignment mark, a mark that indicates a serial number, and a mark that indicates a type of the wiring substrate.

* * * * *